United States Patent
Shinohara

Patent Number: 5,914,277
Date of Patent: Jun. 22, 1999

[54] METHOD FOR FORMING METALLIC WIRING PATTERN

[75] Inventor: Keiji Shinohara, Kanagawa, Japan

[73] Assignee: Sony Corporation, Tokyo, Japan

[21] Appl. No.: 08/862,360

[22] Filed: May 23, 1997

[30] Foreign Application Priority Data

May 27, 1996 [JP] Japan .................................. 8-132380

[51] Int. Cl.⁶ .................................................. H01L 21/00
[52] U.S. Cl. ......................... 438/720; 438/742; 438/738; 438/714; 438/705
[58] Field of Search .................................... 438/636, 720, 438/725, 737, 738, 740, 742, 705, 714

[56] References Cited

U.S. PATENT DOCUMENTS 5,126,289  6/1992  Ziger ........................................ 438/720
5,167,762  12/1992  Car et al. ................................ 438/714

Primary Examiner—William Powell
Attorney, Agent, or Firm—Hill & Simpson

[57] ABSTRACT

The present invention provides a method for forming a metallic wiring pattern, in which narrowing of a resist during patterning of a metallic film is prevented, adhesion of sputtered metallic film to the side walls of the resist is also prevented, and thereby a highly accurate metallic wiring pattern can be achieved. In the method for forming a metallic wiring pattern according to the present invention, a first dry-etching step is performed using a resist 20 patterned in accordance with a wiring pattern as a mask under conditions achieving a ratio sufficiently close to 1 between the etching selectivity for an organic antireflection film 18 and that for a tungsten film 16 such that the etching reaction proceeds in a manner of transcribing the smooth surface of the organic antireflection film 18 while smoothing uneven portions on the surface of the tungsten film 16; and a second dry-etching is performed under conditions achieving a sufficiently high ratio of the etching selectivity for the tungsten film 16 to that for the resist 20 such that the remaining tungsten film 16 is highly accurately etched into a predetermined tungsten wiring pattern 16*a* while faithfully transcribing the pattern of the resist 20.

10 Claims, 3 Drawing Sheets

METHOD FOR FORMING METALLIC WIRING PATTERN

BACKGROUND OF THE INVENTION

1. Field of the Invention

The present invention relates to a method for forming a metallic wiring pattern, and particularly, to a method for forming a metallic pattern using a refractory metal such as tungsten (W) as a wiring material.

2. Description of the Related Art

In proportion to size reduction in LSIs (Large Scale Integration), tungsten wiring is increasingly employed as metallic wiring since tungsten wiring patterns have small electric resistance and superior thermostability. Tungsten films are, however, readily affected by light reflection from the film surface during exposure in a lithographic process, and therefore, resolution deteriorates. Due to this, fine patterning of tungsten films by a photoresist technique has been extremely difficult. As a remedy for this, a method has been investigated, in which an antireflection film is initially formed on a tungsten film, and a resist pattern is formed thereon. Typical examples of such antireflection films include inorganic types and organic types.

For example, TiN antireflection films are known as of inorganic type. The use of such a TiN antireflection film, however, cannot completely prevent light reflection due to unevenness of the tungsten film surface itself which generates film thickness variation in the direction perpendicular to incident light. Accordingly, in cases of tungsten films, complete antireflection can rarely be achieved by employing an antireflection film based on an inorganic material such as TiN.

On the other hand, application of an organic material to the surface of a tungsten film is known as a method using an organic antireflection film. In this method, an organic material containing a coloring matter which can absorb light having the exposure wavelengths is applied to the entire surface of a tungsten film beforehand. In this case, since the coloring matter is light absorbent in the exposure wavelength range, antireflection can be achieved when the film thickness is sufficient. Next, a typical conventional method for forming a tungsten wiring pattern using such an organic antireflection film will be illustrated with reference to FIG. 5.

As is shown in FIG. 5, a silicon oxide film 12 is initially formed on a substrate 10, and a tungsten film 16 is formed by CVD (Chemical Vapor Deposition) on the silicon oxide film 12 with a titanium-based intermediate film 14 intervening therebetween. Hereupon, this titanium-based intermediate film 14 intervening between the silicon oxide film 12 and the tungsten film 16 is disposed for improving adhesion between the silicon oxide film 12 and the tungsten film 16.

Subsequently, an organic antireflection film 18 is applied to the tungsten film 16. At this time, although the tungsten film 16 has surface unevenness, a smooth surface can be achieved by application of the organic antireflection film 18. Additionally, a resist 20 is formed on the organic antireflection film 18 having such a smoothed surface by lithography so as to be patterned in accordance with a wiring pattern. At this time, since the organic antireflection film 18 is formed on the tungsten film 16, reflection of exposure light due to surface unevenness of the tungsten film can be reduced, pattern resolution can be improved, and a resist 20 patterned in accordance with a predetermined fine wiring pattern can be formed.

Next, the organic antireflection film 18 and the tungsten film 16 are selectively dry-etched using the resist 20 patterned in accordance with the wiring pattern as a mask to form a predetermined fine tungsten wiring pattern.

Incidentally, in order to form a predetermined fine tungsten wiring pattern by the above-described conventional method for forming a tungsten wiring pattern using an organic antireflection film as shown in FIG. 5, the selective dry-etching of the organic antireflection film 18 and the tungsten film 16 should be carried out so as not to cause narrowing of the resist 20 used as a mask patterned in accordance with a predetermined wiring pattern.

Such selective etching is, however, accompanied by some difficulties. For example, when an oxygen-based etching gas is used to etch the organic antireflection film 18 and the tungsten film 16 using the resist 20 as a mask, the etching process should necessarily be performed under a low pressure with a high ionic energy level. In an etching process with a high ionic energy level, however, the underlying tungsten film 16 is sputtered at the time of etching off the organic antireflection film 18, the sputtered tungsten adheres to the side walls of the resist 20 to form tungsten adhering portions 22, and thus the resist pattern substantially becomes thicker.

In order to prevent such an event, the amount of tungsten sputtered from the tungsten film 16 should be decreased by reducing the ionic energy level. With a reduced ionic energy level, however, narrowing of the resist pattern by oxygen radicals can occur.

As an alternative method, suppression of over-etching can also suppress sputtering of the tungsten film 16 in the etching process with a high ionic energy level. This method is, however, defective in a case where the organic tungsten film 18 remains in depressions on the surface of the tungsten film 16 since such residual portions serve as masks to undesirably form remaining non-etched portions having the shape of a needle.

SUMMARY OF THE INVENTION

The present invention has been conceived in order to solve the above-described problems, and its object is to provide a method for forming a metallic wiring pattern in which narrowing of a resist during patterning of a metallic film is prevented, adhesion of sputtered metallic film to the side walls of the resist is also prevented, and thereby a highly accurate metallic wiring pattern can be obtained.

The above-described object can be achieved by the method for forming a metallic wiring pattern according to the present invention described below.

Specifically, an aspect of the present invention is a method for forming a metallic wiring pattern, comprising:

a first process for forming a metallic film on a substrate;

a second process for forming an antireflection film having a smooth surface on the metallic film;

a third process for forming a resist having a predetermined pattern on the antireflection film; and a fourth process for etching the antireflection film and the metallic film using the resist as a mask under conditions achieving a ratio close to 1 between the etching selectivity for antireflection film and that for the metallic film.

In this method for forming a metallic wiring pattern, since the antireflection film and the metallic film are etched under conditions achieving a ratio close to 1 between the etching selectivity for the antireflection film and that for the metallic film, the etching can proceed in a manner of transcribing the smooth surface of the antireflection film. Accordingly, even if uneven portions are present on the surface of the metallic film, they can be evenly etched off. As a result, a fine predetermined metallic wiring pattern can be achieved without generation of needle-shaped remnants.

Incidentally, in the above-described method for forming a metallic wiring pattern, the antireflection film is preferably an organic antireflection film, and the second process preferably includes coating the metallic film with the organic antireflection film and smoothing the surface of the antireflection film.

By using an organic coating film as the antireflection film, the surface of the antireflection film formed on the metallic film can readily be made smooth.

Additionally, the method for forming a metallic wiring pattern according to the present invention may further include a fifth process subsequent to the fourth process for etching the metallic film using the resist as a mask under conditions achieving a higher ratio of the etching selectivity for the metallic film to that for the resist in comparison to the ratio of the same in the fourth process.

In this case, the antireflection film and the metallic film are etched under conditions achieving a ratio close to 1 between the etching selectivity for the antireflection film and that for the metallic film such that uneven portions on the surface of the metallic film are etched off to be made smooth; and subsequently, the metallic film is further etched under conditions achieving a high ratio (a ratio above 1) of the etching selectivity for the metallic film to that for the resist. According to this manner, a predetermined fine resist pattern can be faithfully transcribed into a wiring pattern, and therefore, a predetermined fine metallic wiring pattern can be obtained without generation of needle-shaped remnants.

Incidentally, in the above-described method for forming a metallic wiring pattern, the etching in the fourth process is preferably a dry-etching using an etching gas composition which contains a chlorine-based gas and a fluorine-based gas.

By employing a dry-etching for etching the antireflection film and the metallic film using the resist as a mask, advantages of dry-etching such as high accuracy, good reproducibility, and superiority in fine processing can be introduced into the method, and in addition, etching conditions achieving a ratio close to 1 between the etching selectivity for the antireflection film and that for the metallic film can be readily achieved by adjusting the composition of the etching gas. Accordingly, the etching can proceed in a manner of transcribing the smooth surface of the antireflection film, and uneven portions which may be present on the surface of the metallic film can be evenly etched off. Incidentally, such a ratio close to 1 can also be achieved by controlling RF bias power applied during said dry-etching.

Additionally, in the above-described method for forming a metallic wiring pattern, the etching in the fifth process is also preferably a dry-etching using an etching gas composition which contains a chlorine-based gas and a fluorine-based gas.

By employing a dry-etching for the etching in the fifth process, advantages of dry-etching such as high accuracy, good reproducibility, and superiority in fine processing can be introduced into the method, and in addition, etching conditions achieving a high ratio of the etching selectivity for the metallic film to that for the resist can be readily achieved by adjusting the composition of the etching gas. Accordingly, faithful transcription of the fine resist pattern into a wiring pattern can be achieved, and therefore, a predetermined fine metallic wiring pattern can be formed. Incidentally, such a high ratio can also be achieved by controlling RF bias power applied during said dry-etching.

Further, in the above-described method for forming a metallic wiring pattern, the metallic film is preferably a refractory metal film.

By employing a refractory metal film as the metallic film, a predetermined fine refractory-metal wiring pattern can be formed. This can contribute to production of semiconductor devices utilizing advantages inherent in refractory metals, such as low electric resistances and superior thermostabilities.

Moreover, in the above-described method for forming a metallic wiring pattern, the refractory metal is preferably tungsten.

By using tungsten as the refractory metal film, a predetermined fine tungsten wiring pattern can be formed.

BRIEF DESCRIPTION OF THE DRAWINGS

Each of FIGS. 1 to 4 is a schematic sectional view for illustrating the processes in the method for forming a tungsten wiring pattern in relation to an embodiment of the present invention; and Each of FIGS. 5 and 6 is a schematic sectional view for illustrating the processes in a conventional method for forming a tungsten wiring pattern.

DESCRIPTION OF THE PREFERRED EMBODIMENT

Figure 1:
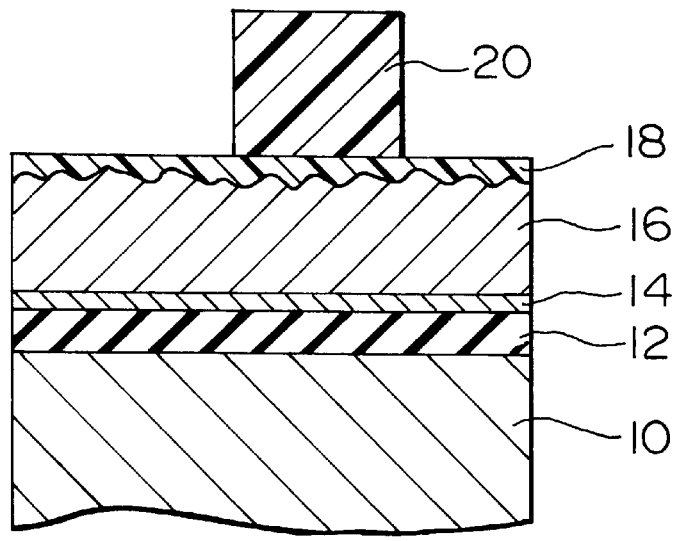
Figure 2:
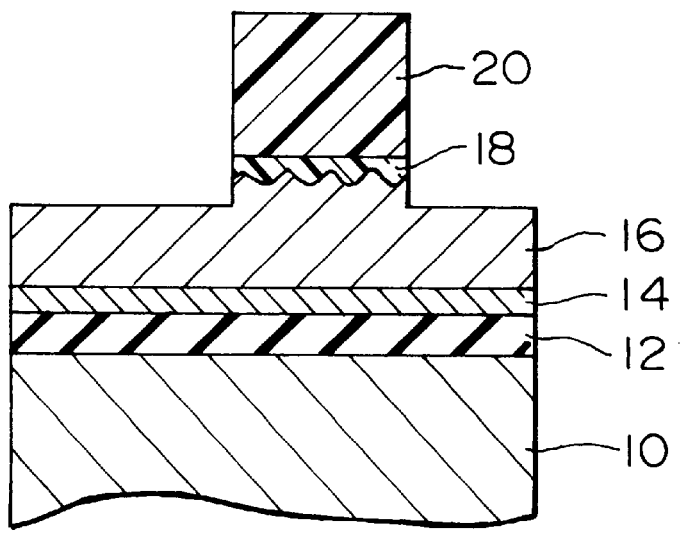
Figure 3:
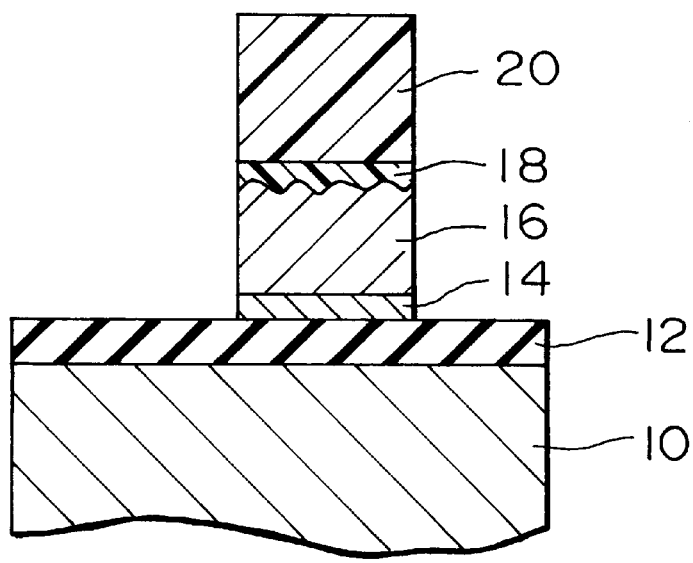

Preferred embodiments of the present invention will be illustrated below with reference to the attached drawings.

Each of FIGS. 1 to 4 is a schematic sectional view for illustrating the processes in the method for forming a tungsten wiring pattern in relation to an embodiment of the present invention.

After a silicon oxide film 12 is formed on a substrate 10, an intermediate film 14 comprising a titanium-based material is formed on the silicon oxide film 12 in order to improve adhesion between the silicon oxide film 12 and the below-described tungsten film. On this intermediate film 14 comprising a titanium-based material, a tungsten film 16 is then formed by CVD.

Succeedingly, the tungsten film 16 is coated with an organic antireflection film 18. Although the surface of the tungsten film is uneven, a smooth surface is achieved after coating with the organic antireflection film 18. Next, a resist 20 patterned in accordance with a wiring pattern is formed by lithography on the organic antireflection film 18 having a smooth surface. At this time, since reflection of exposure light due to unevenness of the tungsten film surface can be restricted by the organic antireflection film 18 formed on the tungsten film 16, a resist 20 in accordance with a predetermined fine wiring pattern can be formed with an improved pattern resolution (cf. FIG. 1).

Subsequently, a first dry-etching step is performed using a dry-etching apparatus, for example, of an ECR (Electron Cyclotron Resonance) type. Specifically, the organic antireflection film 18 and the tungsten film 16 are continuously and selectively etched using the resist 20 patterned in accordance with a wiring pattern as a mask.

At this time, as a feature of this embodiment, the first dry-etching step is performed under etching conditions capable of achieving almost equal etching rates for the organic antireflection film 18 and the tungsten film 16, namely, capable of achieving a ratio close to 1 between the etching selectivity for the organic antireflection film 18 and that for the tungsten film 16. Accordingly, in addition to the organic antireflection film 18, uneven portions on the interface between the organic antireflection film 18 and the tungsten film 16 are etched in a manner of transcribing the smooth surface of the organic antireflection film 18. As a result, if the first etching is stopped when the uneven portions on the surface of the tungsten film 16 are sufficiently removed, the resulting surface of the exposed tungsten film 16 can be smoothed (cf. FIG. 2).

Next, a second dry-etching step is performed using the resist 20 as a mask to selectively etch the remaining tungsten film 16 having a smoothed surface.

Characteristically, this second dry-etching step is performed under etching conditions capable of achieving an etching rate for the tungsten film 16 sufficiently higher than that for the resist 20, namely, capable of achieving a sufficiently high ratio of the etching selectivity for the tungsten film 16 to that for the resist 20. Accordingly, the tungsten film 16 can be etched more selectively than the resist 20, and therefore, the fine pattern of the resist 20 can be faithfully transcribed into a tungsten wiring pattern.

Incidentally, also in the second dry-etching step, since the surface of the tungsten film 16 to be etched is already smooth at the start of the etching, the tungsten film 16 is etched in a manner of transcribing the smooth surface. As a result of the second dry-etching step, the remaining tungsten film 16 and the intermediate film 14 comprising a titanium-based material are etched off (cf. FIG. 3).

Figure 4:
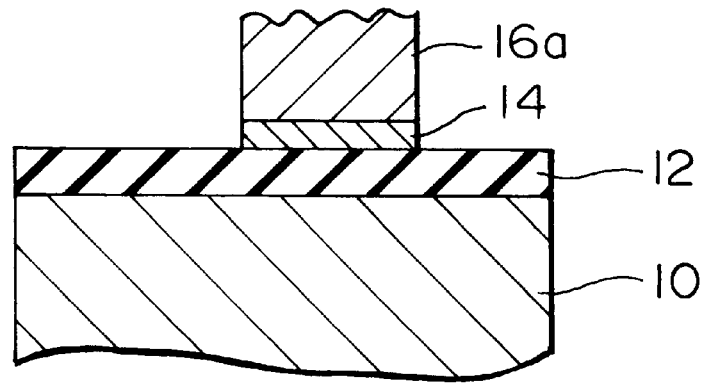
Figure 5:
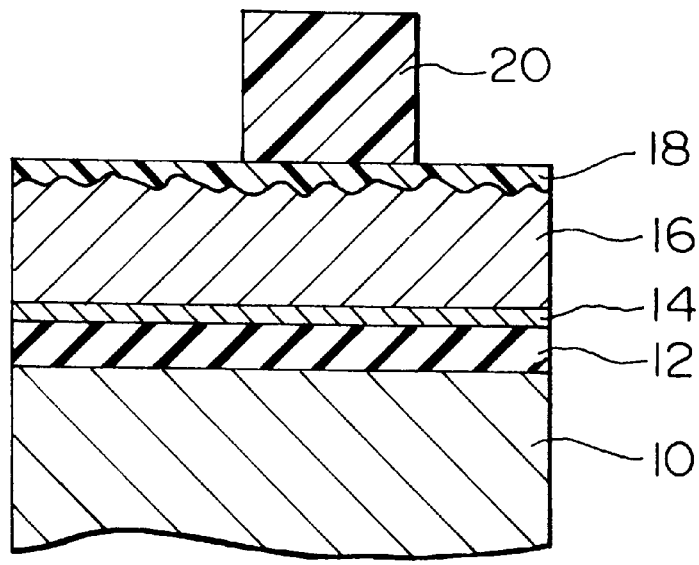
Figure 6:
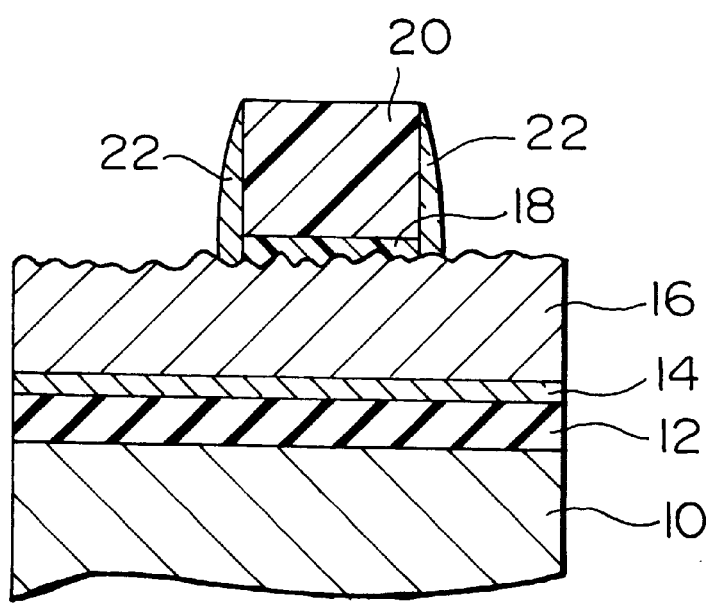

Succeedingly, the resist 20 is removed, and thus a predetermined fine tungsten wiring pattern 16a is formed on the silicon oxide film 12 on the substrate 10 with intervention of the intermediate film 14 comprising a titanium-based material (cf. FIG. 4).

According to the method for forming a tungsten wiring pattern based on this embodiment, the organic antireflection film 18 and the tungsten film 16 can be etched in a manner of transcribing the smooth surface of the organic antireflection film 18 by the first dry-etching step with a ratio close to 1 between both etching selectivities for the films, and the surface of the tungsten film 16 can be smoothed when the antireflection film 18 and the uneven portions on the surface of the tungsten film 16 are etched off. As a result, the antireflection film 18 does not remain in depressions on the surface of the tungsten film 16.

Further, since the remaining tungsten film 16 having a smoothed etching surface is etched in the second dry-etching step with a sufficiently high ratio of the etching selectivity for the tungsten film 16 to that for the resist 20, the fine pattern of the resist 20 can be faithfully transcribed into a predetermined fine tungsten wiring pattern 16a with high accuracy. Since the tungsten wiring pattern 16a thus formed is free of needle-shaped remnants due to the residual organic antireflection film 18 in the depressions on the surface of the tungsten film 16, high reliability can be achieved.

Incidentally, although the first dry-etching step to etch the organic antireflection film 18 and the tungsten film 16 and the second dry-etching step to etch the remaining tungsten film 16 are combined in the above-described embodiment, etching the tungsten film 16 without generation of needle-shaped remnants can also be achieved with only a first dry-etching step. In this case, however, the fine pattern of the resist 20 can rarely be transcribed into a faithful wiring pattern since a first dry-etching with a ratio sufficiently close to 1 between the etching selectivity for the organic antireflection film 18 and that for the tungsten film 16 ordinarily also exhibits ratios close to 1 of the etching selectivity for the resist 20 relative to those for these films.

For this reason, in this embodiment, a first dry-etching step with a ratio sufficiently close to 1 between the etching selectivity for the organic antireflection film 18 and that for the tungsten film 16 and a second dry-etching with a sufficiently high ratio of the etching selectivity for the tungsten film 16 to that for the resist 20 are combined in order to form a fine tungsten wiring pattern 16a with high accuracy.

Further, although an organic antireflection film 18 was formed as an antireflection film in the process for forming a tungsten wiring pattern based on the above-described embodiment, the film is not limited to a specific type such as an organic or inorganic type so long as it can prevent reflection of exposure light.

Moreover, although a tungsten wiring pattern 16a was formed in the above-described embodiment, the wiring material is not necessarily limited to tungsten, and the present invention is also applicable to forming a wiring pattern using other refractory metals such as molybdenum (Mo). Furthermore, the wiring material is not limited to refractory metals, and the present invention is also applicable to forming a wiring pattern using a metal having poor surface morphology.

Practical conditions for the first and second dry-etching steps in the above-described embodiment will be illustrated below.

EXAMPLE 1

The first dry-etching step with a ratio sufficiently close to 1 between the etching selectivity for the organic antireflection film 18 and that for the tungsten film 16 was performed using an ECR-type dry-etching apparatus under the following conditions.

Etching Gas: $Cl_2/SF_6$=100/100 sccm

Pressure: 2 Pa (Pascal; 1 Pa=7.5×10$^{-3}$ Torr)

Microwave Power: 1,600 W

RF (Radiofrequency) Bias: 40 W (for the substrate)

The etching rates of the tungsten film 16 and the organic antireflection film 18 were each 400 nm/min. under these etching conditions. As a result, the etching reaction proceeded in a manner of transcribing the smooth surface of the organic antireflection film 18, and uneven portions on the surface of the tungsten film 16 were etched off while smoothing the surface.

The second dry-etching step with a sufficiently high ratio of the etching selectivity for the tungsten film 16 to that for the resist 20 was performed also using an ECR-type dry-etching apparatus under the following conditions.

Etching Gas: $Cl_2/SF_6/Ar$=50/300/200 sccm

Pressure: 2 Pa

Microwave Power: 1,600 W

RF Bias: 30 W (for the substrate)

The etching rates of the tungsten film 16 and the resist 20 were 700 nm/min. and 250 nm/min., respectively, under these etching conditions. As a result, the tungsten film 16 remaining after the above first dry-etching step could be highly selectively processed, and a predetermined fine tungsten wiring pattern 16a could be formed.

EXAMPLE 2

The first dry-etching step with a ratio sufficiently close to 1 between the etching selectivity for the organic antireflection film 18 and that for the tungsten film 16 was performed using an ECR-type dry-etching apparatus under the following conditions.

Etching Gas: $Cl_2/SF_6/Ar=50/300/200$ sccm

Pressure: 2 Pa

Microwave Power: 1,600 W

RF Bias: 70 W (for the substrate)

As compared with the first dry-etching step in Example 1, the first dry-etching conditions in this example were characterized by applying an increased RF bias of 70 W instead of 30 W.

The etching rates of the tungsten film 16 and the organic antireflection film 18 were each 700 nm/min. under these etching conditions. As a result, similar to the first dry-etching step in Example 1 except for the raised etching rates, the etching reaction proceeded in a manner of transcribing the smooth surface of the organic antireflection film 18, and uneven portions on the surface of the tungsten film 16 were etched off while smoothing the surface.

The second dry-etching step with a sufficiently high ratio of the etching selectivity for the tungsten film 16 to that for the resist 20 was performed under the following conditions which were the same as the conditions for the second dry-etching in Example 1.

Etching Gas: $Cl_2/SF_6/Ar=50/300/200$ sccm

Pressure: 2 Pa

Microwave Power: 1,600 W

RF Bias: 30 W (for the substrate)

Incidentally, in Examples 1 and 2 above, although a ratio sufficiently close to 1 between the etching selectivity for the organic antireflection film 18 and that for the tungsten film 16 and a sufficiently high ratio of the etching selectivity for the resist film 16 to that for the resist 20 were achieved principally by alteration of the content ratio between a chlorine-based gas and a fluorine-based gas in the etching gas composition, adjustment of the ratio concerning etching selectivity can be achieved not only by such alteration of the etching gas formulation but also by addition of a gas composition capable of raising the etching rate of the resist 20.

As described above, the method for forming a metallic wiring pattern according to the present invention is applicable to forming a wiring pattern with a metallic material having a poor surface morphology, and particularly, is useful for forming a fine refractory metal wiring pattern such as a fine tungsten wiring pattern.

What is claimed is:

1. A method for forming a metallic wiring pattern, comprising:

a first process for forming a metallic film on a substrate;

a second process for forming an antireflection film having a smooth surface on said metallic film;

a third process for forming a resist having a predetermined pattern on said antireflection film; and a fourth process for etching said antireflection film and said metallic film using said resist as a mask under conditions achieving a ratio close to 1 between the etching selectivity for said antireflection film and that for said metallic film.

2. The method for forming a metallic wiring pattern according to claim 1, wherein said antireflection film is an organic antireflection film, and said second process includes coating said metallic film with the organic antireflection film and smoothing the surface of the antireflection film.

3. The method for forming a metallic wiring pattern according to claim 1, wherein the etching in said fourth process is dry-etching using an etching gas composition which contains a chlorine-based gas and a fluorine-based gas.

4. The method for forming a metallic wiring pattern according to claim 3, wherein said ratio close to 1 is achieved by controlling the content ratio between said chlorine-based gas and said fluorine-based gas.

5. The method for forming a metallic wiring pattern according to claim 3, wherein said ratio close to 1 is achieved by controlling RF bias power applied during said dry-etching.

6. The method for forming a metallic wiring pattern according to claim 1, wherein said method further comprises a fifth process subsequent to said fourth process for etching said metallic film using said resist as a mask under conditions achieving a higher ratio of the etching selectivity for said metallic film to that for said resist in comparison to the ratio of the same in said fourth process.

7. The method for forming a metallic wiring pattern according to claim 6, wherein the etching in said fifth process is dry-etching using an etching gas composition which contains a chlorine-based gas and a fluorine-based gas.

8. The method for forming a metallic wiring pattern according to claim 6, wherein said higher ratio is achieved by controlling RF bias power applied during said dry-etching.

9. The method for forming a metallic wiring pattern according to claim 1, wherein said metallic film is a refractory metal film.

10. The method for forming a metallic wiring pattern according to claim 9, wherein said refractory metal film is a tungsten film.

* * * * *